(12) United States Patent
Mohr et al.

(10) Patent No.: US 11,710,534 B1
(45) Date of Patent: Jul. 25, 2023

(54) INTERNAL DATA AVAILABILITY FOR SYSTEM DEBUGGING

(71) Applicant: Micron Technology, Inc., Boise, ID (US)

(72) Inventors: Christian N. Mohr, Allen, TX (US); Scott E. Smith, Plano, TX (US); Manoj Vijay, Dallas, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/682,837

(22) Filed: Feb. 28, 2022

(51) Int. Cl.
| | | |
|---|---|---|
| *G11C 29/52* | (2006.01) | |
| *G11C 29/02* | (2006.01) | |
| *G11C 29/46* | (2006.01) | |
| *G11C 29/00* | (2006.01) | |
| *G11C 29/12* | (2006.01) | |
| *G11C 29/38* | (2006.01) | |
| *G11C 29/04* | (2006.01) | |

(52) U.S. Cl.
CPC ............ *G11C 29/52* (2013.01); *G11C 29/021* (2013.01); *G11C 29/12005* (2013.01); *G11C 29/38* (2013.01); *G11C 29/46* (2013.01); *G11C 29/787* (2013.01); *G11C 2029/0409* (2013.01)

(58) Field of Classification Search
CPC . G11C 29/52; G11C 29/021; G11C 29/12005; G11C 29/38; G11C 29/46; G11C 29/787; G11C 2029/0409
See application file for complete search history.

(56) References Cited

U.S. PATENT DOCUMENTS

| | | | | |
|---|---|---|---|---|
| 5,212,442 A | * | 5/1993 | O'Toole | G11C 29/50 365/201 |
| 6,134,161 A | * | 10/2000 | Taniguchi | G11C 29/1201 365/201 |
| 6,240,535 B1 | * | 5/2001 | Farnworth | G01R 31/318513 257/E21.526 |
| 6,295,243 B1 | * | 9/2001 | Otsuka | G11C 29/48 365/201 |
| 6,990,617 B2 | * | 1/2006 | In | G11C 7/1078 710/36 |
| 7,802,166 B2 | * | 9/2010 | Nygren | G06F 11/1004 714/6.2 |
| 2006/0274594 A1 | * | 12/2006 | Huckaby | G11C 16/20 365/226 |

(Continued)

*Primary Examiner* — Steve N Nguyen
(74) *Attorney, Agent, or Firm* — Fletcher Yoder, P.C.

(57) ABSTRACT

Embodiments presented herein are directed to testing and/or debugging a memory device of a memory module (e.g., a dual in-line memory module (DIMM)) without having to remove the DIMM from a corresponding computing device and without having to interrupt operation of the computing device. A particular memory device (e.g., DRAM) may be identified for testing and/or debugging based on a failure message. However, the failure message may not identify a specific location or hardware of the module that caused the failure. Embodiments presented herein provide techniques to obtain data for analysis to determine and/or deliver a cause of the failure while reducing or eliminating downtime of the computing device. Test modes to do so may include a synchronous test mode, an asynchronous test mode, and an analog compare mode. A test mode may be selected based on the failure or a signal/function of the DRAM to be tested or debugged.

20 Claims, 13 Drawing Sheets

(56) References Cited

U.S. PATENT DOCUMENTS

| | | | | |
|---|---|---|---|---|
| 2007/0165454 A1* | 7/2007 | Saito | ............ | G11C 29/765 |
| | | | | 365/185.01 |
| 2012/0284590 A1* | 11/2012 | Ku | ............ | G06F 11/0772 |
| | | | | 714/799 |
| 2013/0036255 A1* | 2/2013 | Fai | ............ | G11C 29/08 |
| | | | | 711/E12.008 |
| 2013/0262956 A1* | 10/2013 | Haywood | ............ | G06F 11/0787 |
| | | | | 714/763 |

* cited by examiner

INTERNAL DATA AVAILABILITY FOR SYSTEM DEBUGGING

BACKGROUND

Field of the Present Disclosure

Embodiments of the present disclosure relate generally to the field of semiconductor devices. More specifically, embodiments of the present disclosure relate to techniques for debugging an integrated circuit (e.g., a die) of a semiconductor device.

Description of Related Art

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Dynamic random-access memory (DRAM) device arrays include a number of segment sections including row segment sections with interleaved segments and sense amplifiers coupled to sequential row segments. That is, the memory device may include a large number of memory cells. A failure of the memory device may be caused by an issue with a particular memory cell or other hardware. Unless testing is performed on the device, the failure of the particular memory cell may not be apparent until the segment section is implemented in the memory device. To identify the particular cell that is the root cause of the failure, each cell is tested. In some cases, each memory cell (or corresponding memory module) may be removed from the memory device for analysis. This process may be time consuming and cumbersome. Further, the device may not be able to operate (e.g., properly or at all) during the analysis. Thus, the analysis may result in extended periods of downtime for the memory device.

Embodiments of the present disclosure may be directed to one or more of the problems set forth above.

BRIEF DESCRIPTION OF THE DRAWINGS

Various aspects of this disclosure may be better understood upon reading the following detailed description and upon reference to the drawings described below.

DETAILED DESCRIPTION OF SPECIFIC EMBODIMENTS

Figure 1:
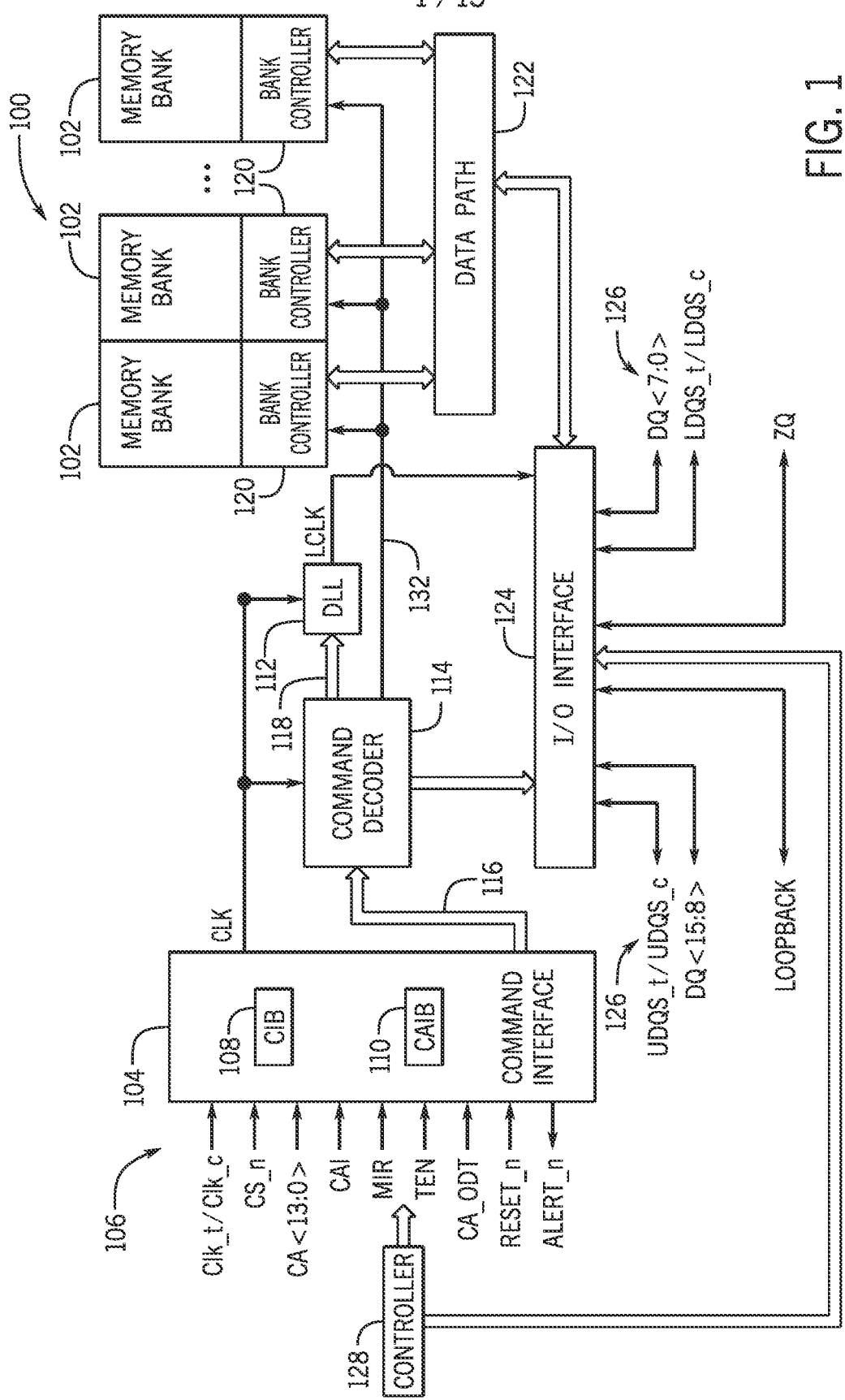
FIG. 1 illustrates a block diagram of certain features of a memory device, according to embodiments of the disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Memory devices exchange data and store the data in memory banks. Each memory bank may include a plurality of sub-arrays which each include a plurality of memory cells in which data is stored. A subgroup of the sub-arrays may be positioned to form a row of a memory array. When a failure occurs in a memory device, a failure message, commonly known as a "blue screen error" may be delivered. The failure message may indicate that a failure occurred in memory, storage, or other hardware of the memory device. While the failure message may indicate specific hardware related to the failure, the memory device may lack sufficient resources to determine and/or deliver a reason for the failure.

Embodiments presented herein provide apparatus and techniques to obtain and deliver data from the memory device and/or a particular memory cell during a debugging mode of the memory device. The obtained data may be used by an external device or entity to determine a reason for the failure. To do so, a testing or debugging mode may be selected based on a signal or function of the memory device to be tested. The testing or debugging mode may include, for example, a synchronous test mode, an asynchronous test mode, and an analog compare mode.

Each test mode may be associated with different outputs of signals on the die (e.g., the memory device). For example, the synchronous test mode may be used to monitor logic states on the memory device, but not signals that are transitioning or used for timing (e.g., pulsing signals). Example signals monitored by the synchronous test mode may include an impedance (ZQ) calibration signal, a CBR counter (e.g., a current address of a refresh counter), a state of the delayed lock loop (DLL) lock point, an ECS error count, a temperature sensor, a DQS oscillator, and the like. The data output from the synchronous test mode may be a continuous data stream that is output on either a rising or falling edge of a strobe signal (e.g., a loopback strobe signal, LBDQS). In some cases, the data output from the synchronous test mode may be a continuous data stream that is output on both the rising and falling edges of the strobe signal.

The asynchronous test mode may be used to monitor a changing or transitioning signal. When the signal being monitored transitions between logic high (e.g., 1) and logic low (e.g., 0) or between voltage levels, the output of the asynchronous test mode may also transition between logic high and logic low. The asynchronous test mode may be used to monitor a signal or test a portion of the memory device corresponding to an LBQ oscillator, a DLL shift output, a DLL lock, an array voltage level (e.g., VARY), a read event, a write event, and the like. During the asynchronous test mode, one signal may be output from the memory device at any given time. Thus, a particular signal may be selected for monitoring and/or testing.

The analog compare mode may be used to monitor or test an internal voltage of the memory device. A reference voltage may be used for comparison to the internal voltage being monitored or tested. The internal voltage being tested may be internal to the memory device and may include an array voltage level (VARY), one or more internal supply voltages, a peripheral voltage (e.g., VPERI), and the like.

Various fuses may correspond to each test mode. For example, for each test mode, a first fuse may be used to initiate (e.g., initialize) a corresponding test mode and a second fuse may be used to terminate the test mode. For example, the first fuse may be blown to initiate the test mode and the second fuse may be blown to terminate the test mode. A fuse may be blown by disrupting or stopping a flow of electrical current through the fuse. A blown fuse may provide an indication to a processor or controller to initialize a corresponding test mode.

Embodiments presented herein improve an efficiency of testing and/or debugging a memory device by enabling the testing or debugging to be performed without having to remove the memory device from a corresponding memory slot of a computing device. That is, the memory device may remain operational during the testing or debugging process. In some cases, a memory module (e.g., a dual inline memory module (DIMM)) having the memory device thereon may be removed from the corresponding memory slot to enable a test mode for the memory module and/or memory device. Once the test mode is enabled, the memory module may be reinserted into the corresponding memory slot for the testing or debugging to be performed. In this way, the embodiments presented herein may reduce or substantially eliminate downtime for the testing and/or debugging process. Further, by performing the testing or debugging process while the memory module is in the corresponding memory slot of the computing device, the testing or debugging process may utilize data which more closely resembles the data that may have caused the initial failure.

FIG. 1 is a block diagram illustrating certain features of a memory device 100. In accordance with some embodiments, the memory device 100 may be a double data rate type five synchronous dynamic random access memory (DDR5 SDRAM) device. Various features of DDR5 SDRAM allow for reduced power consumption, increased bandwidth, and increased storage capacity compared to prior generations of DDR SDRAM. The memory device 100 represents a portion of a single memory chip (e.g., SDRAM chip) having a number of memory banks 102. The memory banks 102 may be, for example, DDR5 SDRAM memory banks. The memory banks 102 may be disposed on one or more chips (e.g., SDRAM chips) arranged on dual inline memory modules (DIMMS). Each DIMM may include a number of SDRAM memory chips (e.g., eight or sixteen memory chips). Each SDRAM memory chip may include one or more memory banks 102, each including one or more arrays of individual memory cells.

For DDR5, the memory banks 102 may be arranged to form bank groups. For example, the memory chip may include sixteen memory banks 102 for an eight gigabyte (8 Gb) DDR5 SDRAM. The memory banks 102 may be arranged into eight memory bank groups, each memory bank group including two memory banks. For a sixteen gigabyte (16 Gb) DDR5 SDRAM, the memory chip may include thirty-two memory banks 102, arranged into eight memory bank groups, each memory bank group including four memory banks 102, for instance.

Various other configurations, organizations, and sizes of the memory banks 102 on the memory device 100 may be utilized depending on the application and design of the overall system. In one embodiment, each memory bank 102 includes a bank controller 120, which controls execution of commands to and from the memory banks 102 for performing various functionality in the memory device, such as decoding, timing control, data control, and any combination thereof.

The command interface 104 of the memory device 100 is configured to receive and transmit a number of signals (e.g., signals 106). The signals 106 may be received from an external device, such as a controller 128 which may be embodied as a processor and/or other device. The controller 128 may provide various signals 106 to the memory device 100 to facilitate transmission and receipt of data to be written to or read from the memory device 100.

As will be appreciated, the command interface 104 may include a number of circuits, such as a clock input buffer (CIB) 108 and a command address input buffer (CAIB) 110, for instance, to ensure proper handling of the signals 106. The command interface 104 may receive one or more clock signals from an external device. Generally, double data rate (DDR) memory utilizes a differential pair of system clock signals, referred to herein as the true clock signal Clk_t and the bar or complimentary clock signal Clk_c. A positive clock edge for DDR refers to the point where a rising true clock signal Clk_t crosses a falling bar clock signal Clk_c. A negative clock edge indicates a transition of a falling true clock signal Clk_t and a rising of the bar clock signal Clk_c. Commands (e.g., read command, write command, etc.) are typically entered on the positive edges of the clock signal. Data may be transmitted or received on both the positive and the negative clock edges.

The clock input circuit 108 receives the true clock signal Clk_t and the bar clock signal Clk_c and generates an internal clock signal, CLK. The internal clock signal CLK is supplied to an internal clock generator, such as a delay locked loop (DLL) circuit 112. The DLL circuit 112 generates a phase controlled internal clock signal LCLK based on the received internal clock signal CLK. The phase controlled internal clock signal LCLK is supplied to the I/O interface 124, for instance, and is used as a timing signal for determining an output timing of read data. In some embodiments, the clock input circuit 108 may include circuitry that splits the clock signal into multiple (e.g., four) phases. The clock input circuit 108 may also include phase detection circuitry to detect which phase receives a first pulse when sets of pulses occur too frequently to enable the clock input circuit 108 to reset between pulses.

The internal clock signal(s)/phases CLK may also be provided to various other components within the memory device 100 and may be used to generate various additional internal clock signals. For instance, the internal clock signal CLK may be provided to a command decoder 114. The command decoder 114 may receive command signals from the command bus 116 and may decode the command signals to provide various internal commands For instance, the command decoder 114 may provide command signals to the DLL circuit 112 over the bus 118 to coordinate generation of the phase controlled internal clock signal LCLK. The phase controlled internal clock signal LCLK may be used to clock data through the I/O interface 124, for instance.

Further, the command decoder 114 may decode commands, such as read commands, write commands, mode-register set commands, activate commands, etc., and provide access to a particular memory bank 102 corresponding to the command via the bus path 132. As will be appreciated, the memory device 100 may include various other decoders, such as row decoders and column decoders, to facilitate access to the memory banks 102.

The memory device 100 executes operations, such as read commands and write commands, based on the command/address signals (e.g., CA<13:0>) of the signals 106 received from an external device, such as the controller 128. In one embodiment, the command/address bus 116 may be a 14-bit bus to accommodate the command/address signals 106 (CA<13:0>). The command/address signals 106 are clocked to the command interface 104 using the clock signals (Clk_t and Clk_c). The command interface 104 may include a command address input circuit 110 which is configured to receive and transmit the commands to provide access to the memory banks 102 through the command decoder 114. In addition, the command interface 104 may receive a chip select signal (CS_n). The CS_n signal enables the memory device 100 to process commands on the incoming CA<13:0> bus. Access to specific memory banks 102 within the memory device 100 is encoded on the CA<13:0> bus with the commands.

In addition, the command interface 104 may be configured to receive a number of other command signals 106. For instance, the signals 106 may include a command/address on die termination (CA_ODT) signal may be provided to facilitate proper impedance matching within the memory device 100. The signals 106 may include a reset command (RESET_n) which may be used to reset the command interface 104, status registers, state machines and the like, during power-up for instance. Other signals 106 received by the command interface 104 may include a command/address invert (CAI) signal which may be provided to invert the state of command/address signals CA<13:0> on the command/address bus 116, for instance, depending on the command/address routing for the particular memory device 100. The signals 106 may include a mirror (MIR) signal to facilitate a mirror function. The MIR signal may be used to multiplex signals so the signals can be swapped to enable certain routing of signals to the memory device 100, based on the configuration of multiple memory devices (such as memory device 100) in a particular application. Various signals (e.g., of the signals 106) may be used to facilitate testing of the memory device 100, such as the test enable (TEN) signal. For instance, the TEN signal may be used to place the memory device 100 into a test mode for connectivity testing.

The command interface 104 may also be used to provide an alert signal (ALERT_n) to the system processor or controller for errors that may be detected. For instance, the alert signal (ALERT_n) may be transmitted from the memory device 100 if a cyclic redundancy check (CRC) error is detected. Other alert signals may also be generated. Further, the bus and pin for transmitting the alert signal (ALERT_n) from the memory device 100 may be used as an input pin during some operations, such as the connectivity test mode executed using the TEN signal, as described above.

Data may be sent to and from the memory device 100, utilizing the command and clocking signals 106 discussed above, by transmitting and receiving data signals 126 through the I/O interface 124. More specifically, the data may be sent to or retrieved from the memory banks 102 over the datapath 122, which includes a plurality of bi-directional data buses. Data I/O signals, generally referred to as DQ signals, are generally transmitted and received on one or more bi-directional data busses. For particular memory devices, such as a DDR5 SDRAM memory device, the I/O signals may be divided into upper and lower bytes. For instance, for an x16 memory device, the I/O signals may be divided into upper and lower I/O signals (e.g., DQ<16:8> and DQ<7:0>) corresponding to upper and lower bytes of the data signals, for instance.

To allow for higher data rates within the memory device 100, some memory devices, such as DDR memory devices may utilize data strobe signals, generally referred to as DQS signals. The DQS signals are driven by the external processor or controller (e.g., the controller 128) sending the data (e.g., for a write command) or by the memory device 100 (e.g., for a read command) For read commands, the DQS signals are effectively additional data output (DQ) signals with a predetermined pattern. For write commands, the DQS signals may be used as clock signals to capture the corresponding input data. As with the clock signals (Clk_t and Clk_c), the DQS signals may be provided as a differential pair of data strobe signals (DQS_t and DQS_c) to provide differential pair signaling during reads and writes. For some memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 100, for instance.

An impedance (ZQ) calibration signal may also be provided to the memory device 100 through the I/O interface 124. The ZQ calibration signal may be provided to a reference pin and used to tune output drivers and on die termination (ODT) values by adjusting pull-up and pull-down resistors of the memory device 100 across changes in process, voltage, and temperature (PVT) values. Because PVT characteristics may affect the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 100 and GND/VSS external to the memory device 100. This resistor acts as a reference for adjusting internal ODT and drive strength of the I/O pins.

In addition, a loopback signal (LOOPBACK) may be provided to the memory device 100 through the I/O interface 124. The loopback signal (LB) may be used during a test or debugging phase (before implementation) to set the memory device 100 into a mode wherein signals are looped back through the memory device 100 through the same pin. For instance, the loopback signal may be used to set the memory device 100 to test the data output (DQ) of the memory device 100. Loopback may include both a data (LBDQ) and a strobe (LBDQS) or possibly just a data pin. This is generally intended to be used to monitor the data captured by the memory device 100 at the I/O interface 124.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 100), etc., may also be incorporated into the memory device 100. Accordingly, it should be understood that the block diagram of FIG. 1 is provided to highlight some functional features of the memory device 100 to aid in the subsequent detailed description. Furthermore, although the foregoing has discussed a DDR5 memory device, the level shifters discussed herein may be used any type of electronic device and/or other types of memory, such as a double-data rate type 4 DRAM (DDR4) memory device.

Figure 2:
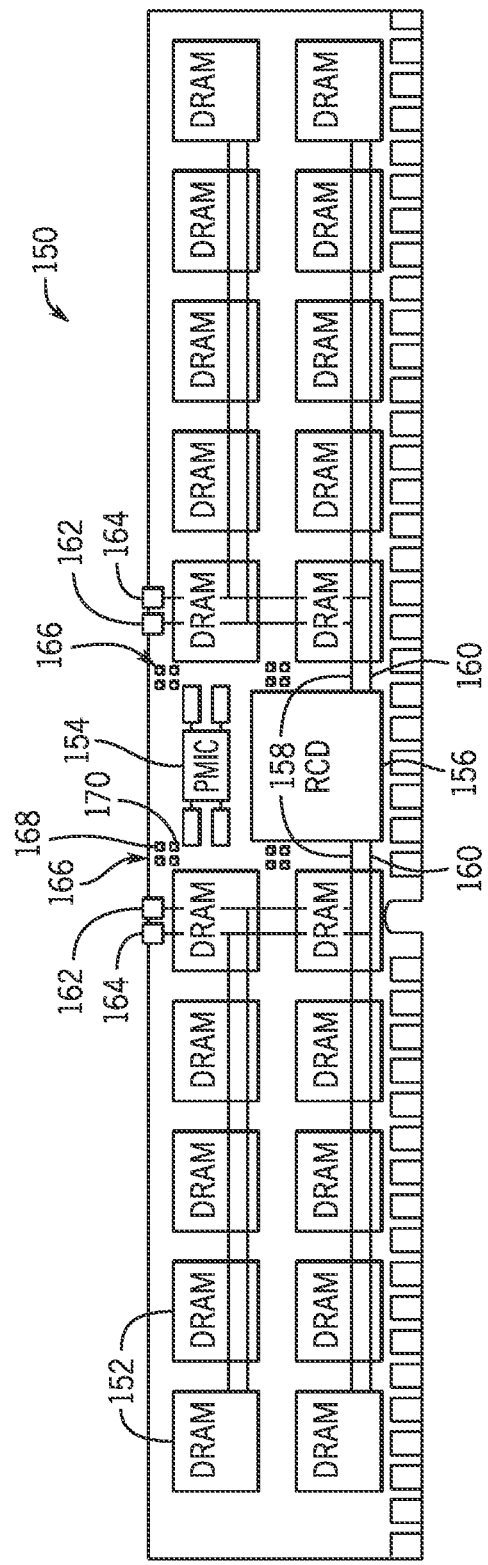
FIG. 2 illustrates a schematic block diagram of a dual in-line memory module (DIMM), according to embodiments of the present disclosure.

FIG. 2 illustrates a schematic block diagram of a dual in-line memory module (DIMM) 150, according to embodiments of the present disclosure. As discussed above, the DIMM 150 includes a number of Dynamic Random Access Memory (DRAM) chips or memory devices 152 disposed on each side of the DIMM 150. The DRAM devices 152 may correspond to the memory device 100, including memory banks 102 discussed with respect to FIG. 1. The DIMM 150 includes a power management integrated circuit (PMIC) 154 and a registering clock driver (RCD) 156. The PMIC 154 may control a power supplied to the DIMM 150 including each DRAM device 152. The RCD 156 may provide a clock signal to the DRAM device 152. For example, the RCD 156 may provide a first clock signal to the DRAM devices 152 on a first side of the RCD 156 and a second clock signal to the DRAM devices 152 on a second side of the RCD 156. The DIMM 150 may include one or more data lines 158, 160.

Each DRAM device 152 may be coupled via a first data line 158 and a second data line 160. The first data line 158 and the second data line 160 may be coupled to the RCD 156. The first data line 158 may be coupled to a first pin 162 and the second data line 160 may be coupled to a second pin 164. In some embodiments, the pins 162, 164 may be disposed along an edge of the DIMM 150. That is, the pins 162, 164 may be accessible external to the DIMM 150 while the DIMM 150 is operating normally, even though a test mode is enabled. In some cases, the pins 162, 164 may be added to the DIMM 150 for the testing/debugging operations discussed herein. In some embodiments, the pins 162, 164 may be existing pins on the module. In that case, the pins may be used for testing and debugging evaluation during manufacturing of the DIMM 150. The pins 162, 164 may be referred to as a loopback (LBDQ) pin and a loopback strobe (LBDQS) pin. Thus, the data lines 158, 160 may correspond to loopback data (LBDQ) signal and a loopback strobe (LBDQS) signal.

The first pin 162 and the second pin 164 may provide access to data on the first data line 158 and the second data line 160 external to the DIMM 150. For example, the pins 162, 164 may provide access to data that is normally not accessible external to the DIMM 150. It should be understood that routing of the first data line 158 and the second data line 160 on the DIMM 150 may be different than shown. It should also be understood that the architecture of the DIMM 150 depicted in FIG. 2 is merely an example and that any suitable architecture may be used. Advantageously, the data lines 158, 160 and the pins 162, 164 enable data to be accessed external to the DIMM 150 for testing and/or debugging of the DIMM 150 without the DIMM 150 being removed from a corresponding memory slot of a computing device.

As shown, the DIMM 150 includes a number of fuses 166. Each of the fuses 166 may be associated with a test mode, a particular DRAM device 152, a particular signal or function of a DRAM device 152, and the like. For example, a first fuse 168 and a second fuse 170 may be associated with a synchronous test mode. The first fuse may be blown to initialize the synchronous test mode and the second fuse 170 may be blown to terminate the synchronous test mode. In another example, the first fuse 168 may be blown to enable access to data/signal of a particular DRAM device 152 and the second fuse 170 may be blown to disable access to the data/signal. Advantageously, the fuses 166 may enable testing/debugging of a particular DRAM device 152 and/or particular data/signals of a particular DRAM device 152.

Figure 3:
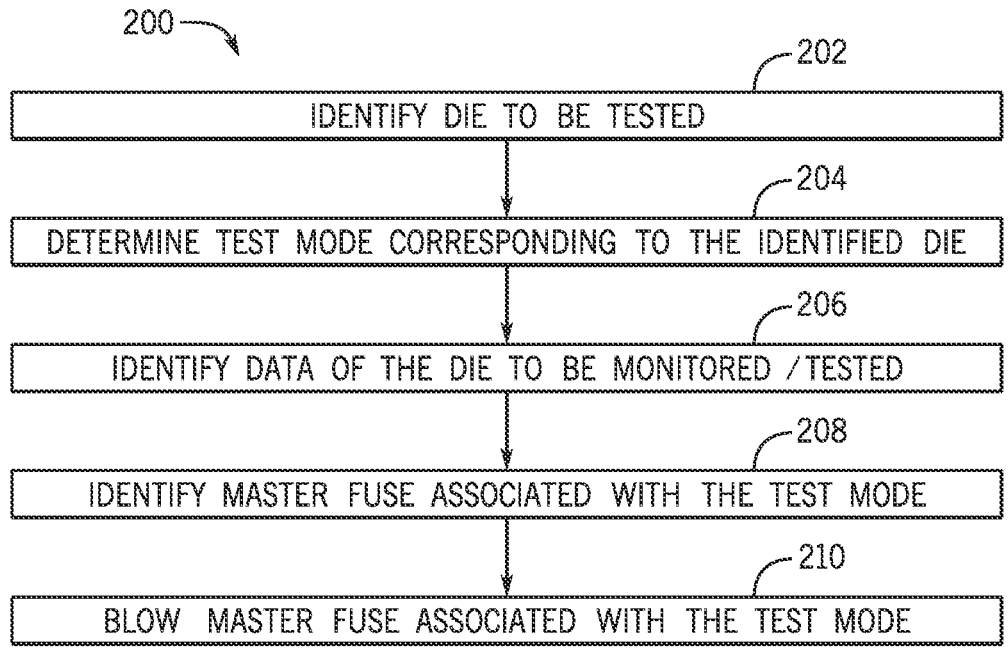
FIG. 3 is a flowchart illustrating operations to select a test mode for a memory module or memory die, according to embodiments of the present disclosure.

FIG. 3 is a flowchart illustrating operations 200 to select a test mode for a memory module or memory die (e.g., the DRAM device 152 of FIG. 2), according to embodiments of the present disclosure. The operations 200 may be executed by a processor or controller of a computing device in which the memory module, such as the DIMM 150 of FIG. 2, is operating. For example, the operations 200 may be performed by a host device external to the DIMM 150, such as the controller 128 of FIG. 1. It should be understood that, while the operations 200 are shown in a specific sequence, the operations 200 may be implemented in any suitable order, and at least some of the operations 200 may be skipped altogether. In some cases, the operations 200 may be executed by test equipment such as automated test equipment (ATE) and/or an oscilloscope.

At operation 202, a die, such as the DRAM devices 152 on the DIMM 150 of FIG. 2 may be identified. That is, a processor of the computing device in which the die is disposed may receive a failure message and identify a particular die on the memory module (e.g., a DRAM device 152 on the DIMM 150 of FIG. 2) in which the failure occurred. In some cases, the failed die may be identified based on the failure message. In other cases, the failure message may identify a particular signal or function that failed but not the corresponding memory die. In that case, the processor may select a first memory die on which to perform a test and/or debugging operation as discussed herein. If an issue with the first memory die is detected, remedial action may be performed on the first memory die. If an issue is not detected with the first memory die, the processor may perform the test and/or debugging operation on additional dies on the memory module until an issue is detected.

In some cases, at or before operation 202, a particular memory module (e.g., the DIMM 150 of FIG. 2) may be identified as being associated with the failure message. In that case, the failure message may not identify a particular die to be tested. The failure message may also identify a particular signal or function to be tested. For example, the signal or function to be tested may be associated with multiple dies on the memory module. One or more fuses, such as the fuses 166 of FIG. 2, may be used to access data from a memory module and/or a memory die. That is, a first fuse may be blown to enable access to data from the module and/or die and a second fuse may be used to disable access to the data.

At operation 204, the processor may determine a test mode corresponding to the identified die. The test mode may be used to determine a cause for the failure message by testing and/or monitoring one or more signals associated with the identified die and the corresponding test mode. In some cases, the test mode to be used to monitor or test the die/module may be based at least in part on a type of signal or data to be monitored or tested. For example, the failure message may indicate a failure with a CBR counter of a particular die on the memory module. In that case, a test mode may be selected which enables access to the CBR counter value (e.g., signal). That is, once a die fails, the processor may enable a test mode associated with that die and/or associated with the particular signal or data to be tested. At operation 206, the processor may identify a particular signal or data on the die/module to be monitored and/or tested based on the selected test mode.

At operation 208, the processor may identify a master fuse associated with the test mode and or the signal or data to be monitored and/or tested. That is, each test mode may be associated with at least one master fuse. For example, a first master fuse associated with the test mode may be blown to initiate the corresponding test mode and a second master fuse may be blown to disable or terminate the corresponding test mode. At operation 210, the master fuse associated with the test mode identified at operation 206 is blown to initiate the test mode.

Using (e.g., blowing) fuses to initiate and terminate a test mode enables access to internal data without using a decoder. Thus, embodiments presented herein allow external access to signals internal to the memory module without significantly increasing a physical size of the circuitry of the memory module.

Figure 4:
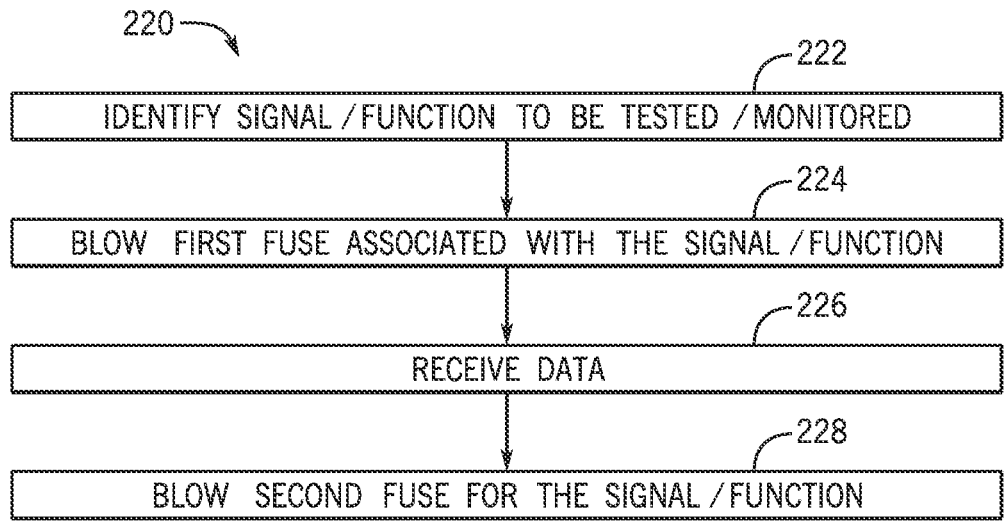
FIG. 4 is a flowchart illustrating operations to select a signal and/or function of a memory die for testing, according to embodiments of the present disclosure.

FIG. 4 is a flowchart illustrating operations 220 to select a signal and/or function of a memory die, such as the DRAM device 152 of FIG. 2, for testing, according to embodiments of the present disclosure. The operations 220 may be executed by a processor of a computing device in which the memory die is disposed. For example, the operations 220 may be performed by a host device external to the DIMM 150, such as the controller 128 of FIG. 1. It should be understood that, while the operations 220 are shown in a specific sequence, the operations 220 may be implemented in any suitable order, and at least some of the operations 220 may be skipped altogether.

At operation 222, a signal/function of the memory module to be tested is identified. In some cases, the signal/function to be tested may be identified based on the failure message. In some cases, the signal/function to be tested may be identified based on a location of the failure or a memory device (e.g., a DRAM device 152 of FIG. 2) associated with the failure. At operation 224, a first fuse associated with the signal/function to be tested is blown. Blowing the fuse may enable the testing/debugging process to access data related to the signal/function being tested.

At operation 226, data associated with the signal/function is received. A type of the received data may depend on the test mode being used. For example, if the synchronous test mode is used, the received data may be a serial (e.g., continuous) stream of data until the testing/debugging operation is terminated (e.g., by blowing a second fuse). If the test mode is the asynchronous test mode, the data received may be associated with the particular signal/function being tested (e.g., a transition or timing of a transition of the signal/function). If the test mode is the analog compare mode, the data received may be a voltage level associated with the signal/function being tested.

At operation 228, a second fuse associated with the signal/function being tested may be blown. The second fuse may terminate the testing/debugging operation or disable the data being received. As discussed above, using fuses to enable and disable access to data on the die without adding additional circuitry to the die (or adding minimal circuitry).

Figure 5:
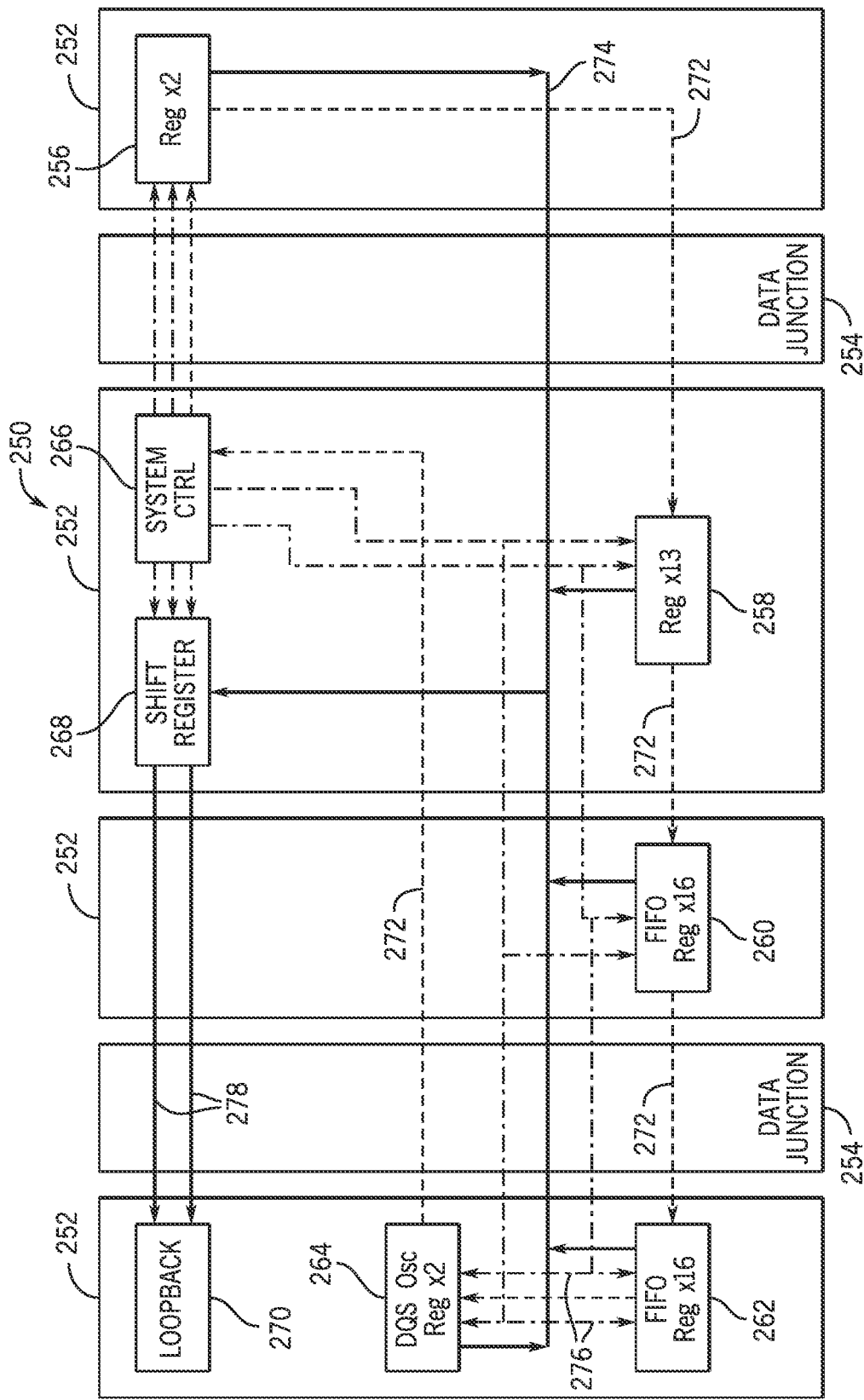
FIG. 5 illustrates a functional block diagram depicting signal routes between registers for a synchronous test mode, according to embodiments of the present disclosure.

FIG. 5 illustrates a functional block diagram 250 depicting signal routes between registers for a synchronous test mode, according to embodiments of the present disclosure. As shown, various signals corresponding to a memory device, such as the DRAM device 152 of FIG. 2, may be represented as blocks 252. Each block 252 may correspond to or may be coupled to a data register 256, 258, 260, 262, 264. For example, a first register 256 may correspond to a delayed lock loop (DLL) right end, a second register 258 may correspond to command address, a third register 260 may correspond to a lower data signal, and a fourth register 262 may correspond to an upper data signal. The registers 256, 258, 260, 262, 264 may be used to access data from corresponding memory device, such as the DRAM device 152 of FIG. 2. For example, data lines 274 may couple each register 256, 258, 260, 262, 264 to a shift register 268 to access data from the registers 256, 258, 260, 262, 264. A DRAM device 152associated with a blown fuse may drive a data signal (e.g., LBDQ/LBDQS) onto the data lines 274 of the DIMM 150. In some embodiments, the data lines 274 may be coupled to a solder joint on the DIMM 150 to enable access to the data signals.

A data junction 254 may be disposed between some or each of the blocks 252 and the corresponding registers 256, 258, 260, 262, 264. The data junctions 254 may connect signals from different blocks 252 and may contain repeaters to improve signal strength as the signals are routed there through, including data signals (e.g., LBDQ and LBDQS) and various control signals. That is, the data junctions 254 may stabilize signals propagating throughout the DIMM 150. While one register is shown in each functional block 252, it should be understood that each block 252 may include or be associated with any suitable number of registers 256, 258, 260, 262, 264.

The registers 256, 258, 260, 262, 264 may be disposed in different locations throughout a memory device 152 of a DIMM, such as the DIMM 150 of FIG. 2. That is, each memory device 152 of a DIMM 150 may include a number of registers 256, 258, 260, 262, 264. Thus, data from the registers 256, 258, 260, 262, 264 may be obtained from various locations in the memory device 152 and various locations in the DIMM 150. A shift register 268 and a system controller 266 may be disposed on one of the DRAM devices 152. The shift register 268 and the system controller 266 may be disposed such that a distance between the registers 256, 258, 260, 262, 264 is balanced. That is, the registers 256, 258, 260, 262, 264 may be evenly spaced out within the DRAM devices 152, and the shift register 268 and the system controller 266 may be spaced evenly with respect to the registers 256, 258, 260, 262, 264.

The shift register 268 and the system controller 266 may be used to access and obtain data from the registers 256, 258, 260, 262, 264. For example, once a test mode is selected and a testing/debugging operation is initiated, the shift register 268 and the system controller 266 may receive data from a particular register 256, 258, 260, 262, 264 and provide the data to a loopback output 270. The loopback output 270 may be accessible external to a corresponding DRAM device 152 and/or a corresponding DIMM 150 via one or more pins, such as the pins 162, 164 discussed with respect to FIG. 2. The shift register 268 may obtain the data from the registers 256, 258, 260, 262, 264 and provide the data to the loopback output 270 via data lines 278. In some embodiments, the data may be obtained from the loopback output 270 via solder joints coupled to the data lines 278 on the DIMM 150. That is, the solder joints may enable access to the data internal to the DRAM devices 152 and internal to the DIMM 150.

Each register 256, 258, 260, 262, 264 and the system controller 266 may be coupled via data lines 272. The data lines 272 may be used to transmit a token between the registers 256, 258, 260, 262, 264. The system controller 266 may indicate when a particular register 256, 258, 260, 262, 264 is to pass the token to a next register 256, 258, 260, 262, 264. The system controller 266 may also provide system enable signals and clock signals to the registers 256, 258, 260, 262, 264 and the shift register 268 via data lines 276.

Figure 6:
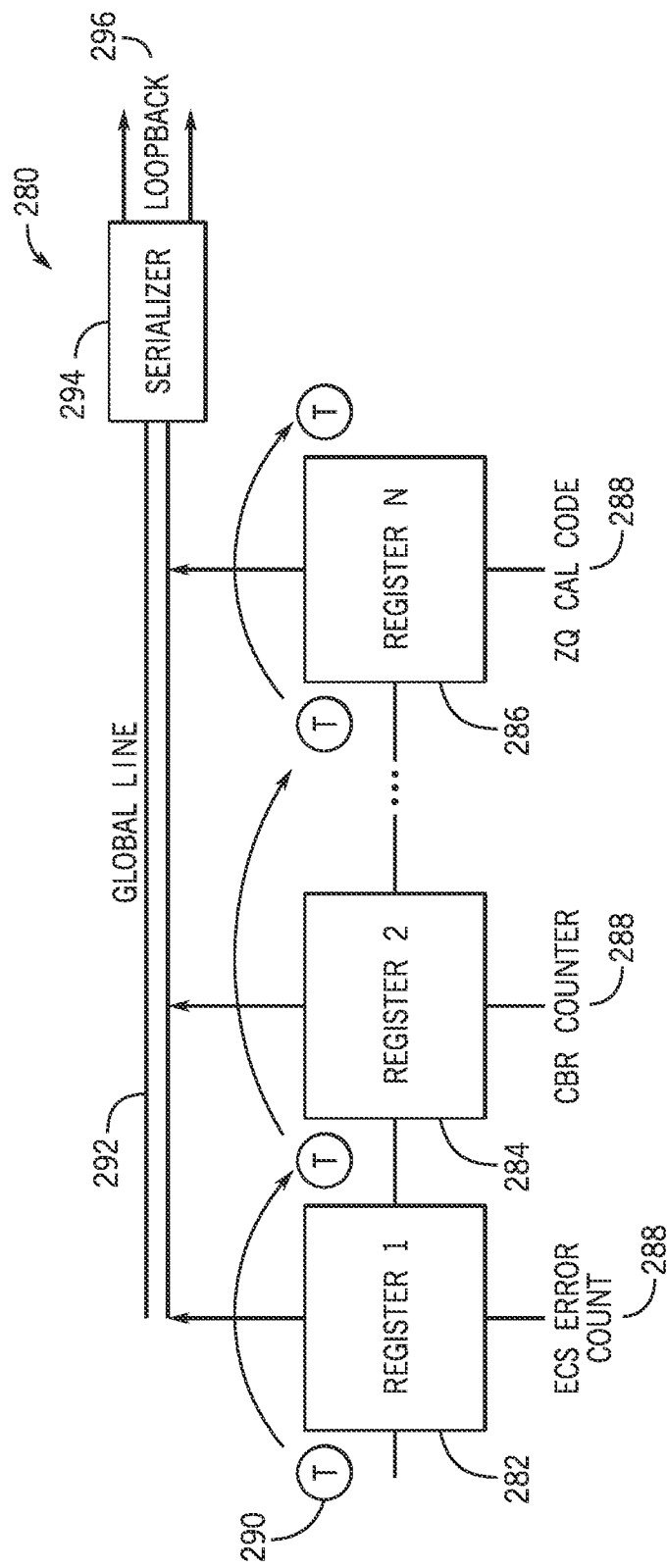
FIG. 6 illustrates a block diagram of circuitry for a synchronous test mode for debugging a memory module and/or a memory die of the memory module, according to embodiments of the present disclosure.

FIG. 6 illustrates a block diagram of circuitry 280 for a synchronous test mode for debugging a memory module and/or a memory die of the memory module, according to embodiments of the present disclosure. In some embodiments, the circuitry 280 may be external to the DRAM devices 152 and/or the DIMM 150 of FIG. 2. For example, the circuitry 280 may be disposed in the controller 128 of FIG. 1. In some embodiments, the circuitry 280 may be disposed in testing equipment (e.g., ATE) and/or an oscilloscope external to the DIMM 150.

As shown, the circuitry 280 for the synchronous test mode utilizes registers 282, 284, 286. The registers 282, 284, 286 may correspond to the registers 256, 258, 260, 262, 264 discussed with respect to FIG. 5. That is, each register may be used to access data associated with a particular signal and/or function 288 associated with a corresponding DRAM device 152 of FIG. 5. For example, a first register 282 may be used to obtain data related to an ECS error count, a second register 284 may be used to obtain data related to a CBR counter, and a third register 286 may be used to obtain data related to a ZQ calibration code. It should be understood that the circuitry 280 may use any suitable number of registers 282, 284, 286 to obtain data related to various signals and functions from the DRAM devices 152.

The data from each register 282, 284, 286 may be output onto a data line (e.g., a global line) 292. In some cases, the data output by the registers 282, 284, 286 may be eight (8) bits. However, the data output to the data line 292 may be four (4) bits per transition of a select clock signal. For example, a particular register 282, 284, 286 may output a first four bits on a first clock edge of the select clock signal and a second four bits on a second clock edge of the select clock signal. That is, the registers 282, 284, 286 may output data to the data line 292 on both falling and rising edges of the select clock signal.

A serializer 294 may receive the data on the data line 292 and may be used to serialize the data on the data line 292. That is, the serializer 294 may separate the four bits on the data line 292 into individual data bits. An output clock for the serialized data may have a higher frequency than the select clock used by the registers 282, 284, 286. The output clock may be used to transmit the serialized data bits to the loopback output 296, which may correspond to the loopback output 270 of the DIMM 150. For example, the serialized data bits may be output using loopback pins, such as the pins 162, 164 of FIG. 2. It should be understood that the registers 282, 284, 286 may output any sufficient number of data bits per clock cycle, such as 2 bits, 4 bits, 8 bits, that is supported by the serializer 294 and other components of the DIMM 150.

A token 290 may be used to enable a particular register 282, 284, 286 to output data to the data line 292. That is, the register 282, 284, 286 with the token 290 is enabled to drive a respective signal (e.g., data) onto the data line 292. Once the enabled register outputs the respective signal onto the data line 292, the token 290 may be advanced to the next register 282, 284, 286. That is, the token 290 may be passed to the next register 282, 284, 286 every eight bits that are output onto the data line 292. In some cases, the token 290 may be passed to the next register based on the select clock signal. That is, the token 290 may be captured by a register using the select clock signal. Once a register 282, 284, 286 receives the token 290, the register 282, 284, 286 is enabled to output data on the data line 292 and may do so based on the select clock signal. Various clock signals used by the registers 282, 284, 286 are discussed with respect to FIG. 7 below.

Figure 7:
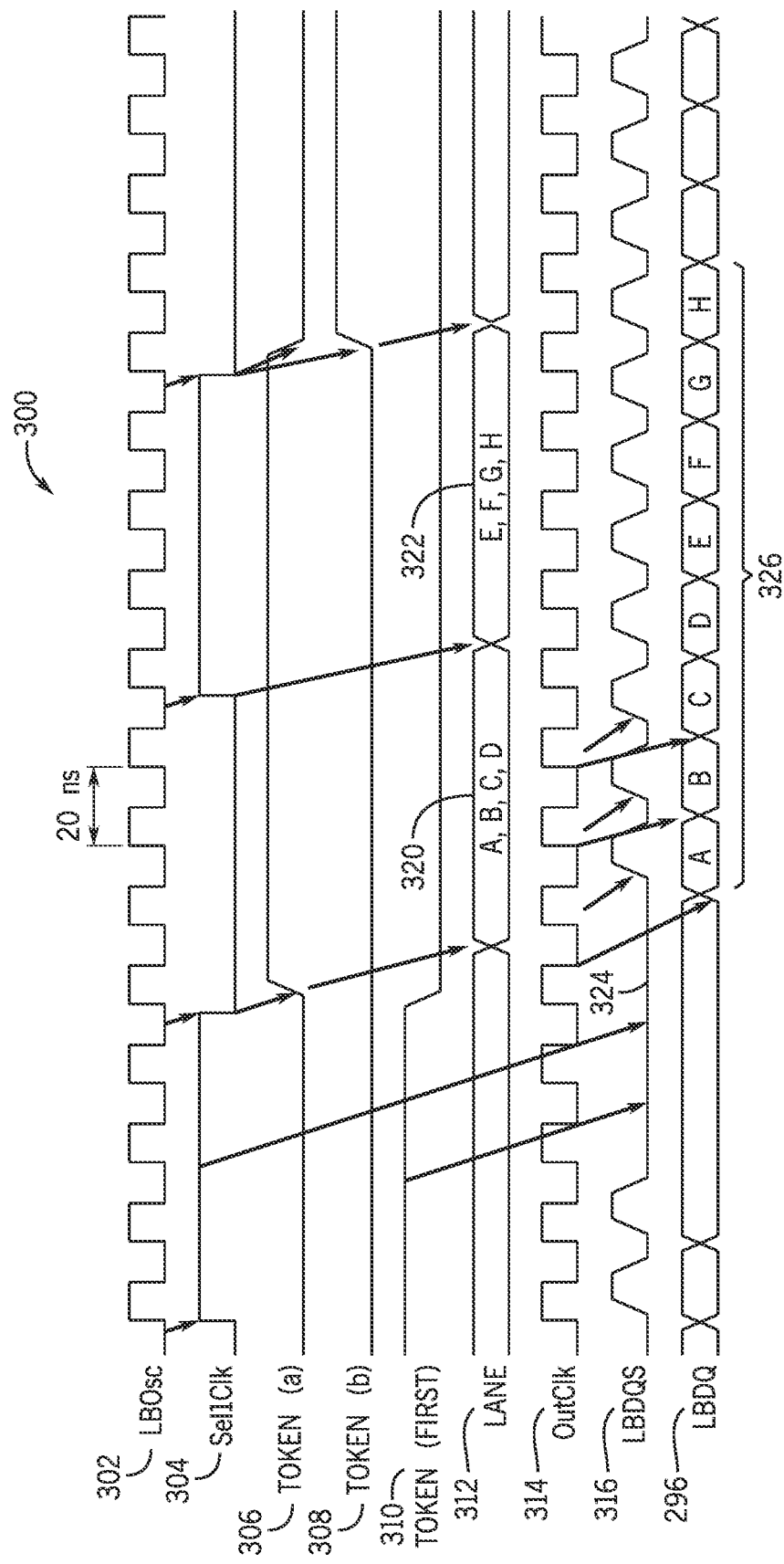
FIG. 7 illustrates a timing diagram of the synchronous test mode of FIG. 6, according to embodiments of the present disclosure.

FIG. 7 illustrates a timing diagram 300 of the synchronous test mode of FIG. 6, according to embodiments of the present disclosure. As shown, the timing diagram 300 depicts various signals used in the synchronous test mode discussed herein. As discussed above, a register 282, 284, 286 may receive a token 290. The token 290 of a first register, such as the register 282 of FIG. 6, may correspond to a token(a) signal 306. A token 290 of a subsequent register, such as the register 284 of FIG. 6, may correspond to a token(b) signal 308.

A first token signal 310 may be a logic high (e.g., 1) when a system debug operation is initialized and may be passed to a first register 282, 284, 286. That is, the first token signal 310 may transition to a logic low (e.g., 0) when the token is passed to the first register 282, 284, 286, indicated by the token signal token(a) 306.

As shown, the first register 282 may output a first four bits (ABCD) 320 to the data line 292 (indicated by the signal 312) based on a corresponding token, token(a) 306, a synchronous clock signal 302, and a select clock signal 304. The first register 282 may output a second four bits (EFGH) 322 to the data line 292 based on the corresponding token, token(a) 306, and an edge of the select clock signal. That is, the second four bits 322 may be output by the first register 282 when the select clock signal 304 transitions between the logic low and the logic high.

The serializer 294 may receive the data output by the first register 282. The serializer 294 may serialize (divide) the data into individual bits 236 and output the serialized bits 236 to the loopback output 296 based on an output clock signal 314 and a loopback strobe signal (LBDQS) 316. Each rising edge of the loopback strobe signal 316 may indicate one bit of information 326 that is ready to be transmitted from the serializer 294. A preamble 324 of the loopback strobe signal 316 may be low for about four clock cycles to indicate a header or beginning of the data to be output via the loopback output 296.

Advantageously, the data output by the loopback output 296 is a serial stream of data that has no end point and no maximum length. Thus, a size of the serial data stream of loopback output 296 may be increased over time to provide additional information related to various states, settings, and operations of a corresponding DRAM device 152. While some circuitry (e.g., the registers 282, 284, 286 and/or the serializer 294) may be added to a memory device, such as the memory device 100 of FIG. 1, the amount and types of data that can be provided via the loopback output 296 for analysis (e.g., testing, debugging, or monitoring) without having to remove the module (e.g., the DIMM 150) from a computing device outweigh any negative effects of the added circuitry such as, for example, physical space and/or power consumption.

Figure 8:
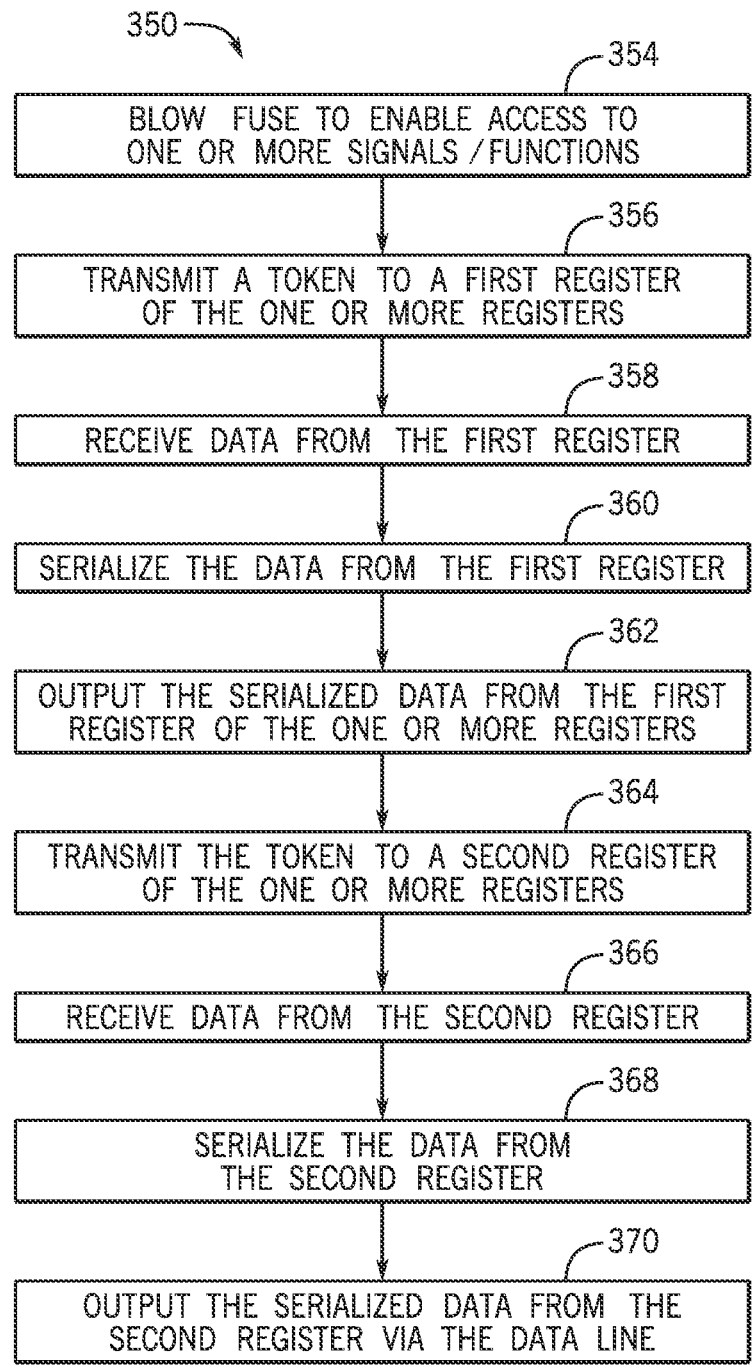
FIG. 8 is a flowchart illustrating operations of the synchronous test mode of FIG. 6, according to embodiments of the present disclosure.

FIG. 8 is a flowchart illustrating operations 350 of the synchronous test mode of FIG. 6, according to embodiments of the present disclosure. The operations 350 may be executed by one or more components of a computing device, such as a controller or processer. For example, the operations 350 may be performed by a host device external to the DIMM 150, such as the controller 128 of FIG. 1. It should be understood that, while the operations 350 are shown in a specific sequence, the operations 350 may be implemented in any suitable order, and at least some of the operations 350 may be skipped altogether. It should be understood that the operations 350 may be part of the synchronous test mode and thus may be performed after the synchronous test mode is initialized. For example, the operations 350 may be performed after a master fuse for the synchronous test mode is blown, as discussed with respect to FIG. 3. In some cases, the operations 350 may include the operations 200 of FIG. 3.

The operations 350 may represent a portion of operations performed for a synchronous testing/debugging operation. For example, the operations 350 may include additional operations for any number of registers of a memory module. The token may be passed to each register in turn and data from each register may be serialized and output via the loopback output.

The operations 350 begin at operation 354, a fuse associated with a signal/function may be blown. The fuse may be blown in response to a system failure based on a failure message. In some cases, the blown fuse may be associated with a location of the failure and/or a location of a register (e.g., a data register) or memory device (e.g., a DRAM device) corresponding to the signals/functions to be accessed.

At operation 356, a token, such as the token 290 of FIG. 6, may be transmitted to a first register of one or more registers. At operation 358, data may be output by the first register onto the data line. In one embodiment, the data output by the first register may be a first four bits and may be output at an edge (e.g., rising or falling) of a select clock. An additional four bits may be output by the first register at the next edge (e.g., rising or falling) of the select clock.

At operation 360, a serializer, such as the serializer 294 of FIG. 6, may serialize the data (e.g., four bits) output by the first register. The serializer may output the serialized data via a loopback output, at operation 362. Once the first four bits from the first register are output, the serializer may serialize and output the additional four bits.

Once the data from the first register is serialized and output via the loopback output, the token may be passed to a second register, at operation 364. At operation 366, data may be output by the second register onto the data line. Similar to the first register, the data output by the second register may be a total of eight bits, output four bits at a time. At operation 368, the serializer may serialize the data bits output by the second register (e.g., in four bit increments). At operation 370, the serialized data from the second register may be output by the serializer via the loopback output.

As discussed above, the serial data output by the synchronous test mode may provide a relatively large amount of data for the testing/debugging procedure. The amount of data may be increased or decreased based on the analysis to be performed. For example, the synchronous test mode may be configured to obtain data from some registers but not all of the registers.

Figure 9:
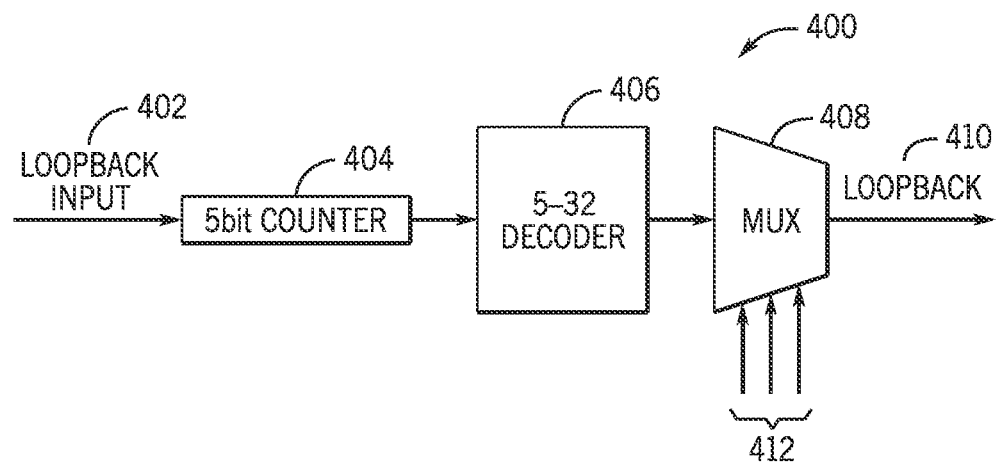
FIG. 9 illustrates a block diagram showing circuitry for an asynchronous test mode using a counter, according to embodiments of the present disclosure.

FIG. 9 illustrates a block diagram showing circuitry 400 for the asynchronous test mode using a counter 404, according to embodiments of the present disclosure. In some embodiments, the circuitry 400 may be external to the DRAM devices 152 and/or the DIMM 150 of FIG. 2. For example, the circuitry 400 may be disposed in the controller 128 of FIG. 1.

As discussed above, the asynchronous test mode may be used to monitor a changing or transitioning signal. A pulsating loopback data signal (LBDQ) may be an input to the counter 404. That is, a LBDQ pin on the memory module, such as the pins 162, 164 of the DIMM 150 of FIG. 2, may receive a pulsing (e.g., oscillating) signal. In some cases, the pulsing signal may be input to the DIMM 150 via a solder joint. A loopback strobe LBDQS pin may be used to as an output 410 for the asynchronous test mode and thus may be accessed external to the memory module.

To initialize the asynchronous test mode, a master fuse may be blown as discussed with respect to FIG. 3. A particular output signal 410 for the asynchronous test mode may be selected using (1) a counter or (2) fuses, as discussed below. If the counter 404 is used to select the output 410, the counter 404 may start at zero and be incremented for each transition of the loopback input (LBDQ) 402. That is, the counter 404 may be incremented for each pulse of the LBDQ input 402. In some cases, the counter 404 may be implemented using a ripple counter. Each increment of the counter 404 may correspond to a different signal 412 to be output 410. For example, for a given increment of the counter 404, the signal 412 may be associated with (1) an LBQ oscillator, (2) a DLL shift output, (3) a DLL lock state, (4) a bank active event, (5) an ECC event, (6) a self refresh event, (7) a read event, or (7) a write event.

The value of the counter 404 may be decoded using a decoder 406. The decoder 406 may provide the decoded counter value to a multiplexer 408 to drive one of the signals 412 to the output 410. In some embodiments, a particular signal 412 may be selected using a number of fuses rather than the counter 404. That is, each signal 412 may be associated with one or more fuses. For a selected signal 412 to be output 410, a first fuse associated with that signal 412 may be blown. The blown first fuse may enable the selected signal 412 to be output 410. Once the selected signal 412 is output 410, a second fuse may be blown to stop the selected signal 412 from being transmitted. That is, the second fuse may disable the selected signal 412 from being output.

Figure 10:
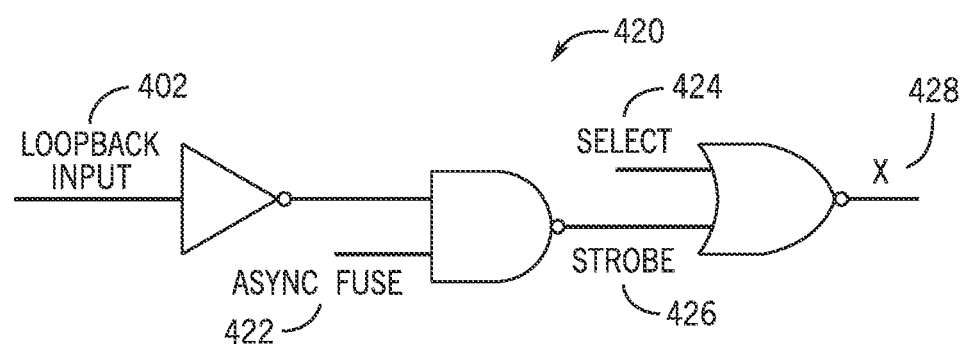
FIG. 10 illustrates a block diagram showing example circuitry for preventing glitch propagation causing a toggling of states for the asynchronous test mode, according to embodiments of the present disclosure.

FIG. 10 illustrates a block diagram showing example circuitry 420 for preventing glitch propagation causing a toggling of states for the asynchronous test mode, according to embodiments of the present disclosure. In some embodiments, the circuitry 420 may be external to the DRAM devices 152 and/or the DIMM 150 of FIG. 2. For example, the circuitry 420 may be disposed in the controller 128 of FIG. 1.

The circuitry 420 may be disposed between the decoder 406 and the multiplexer 408 of FIG. 9. The circuitry 420 may be used to prevent glitch propagation through the decoder 406 as the glitch may inadvertently enable multiple signals 412 to be input into the multiplexer 408 resulting in the output 410 being driven to an unknown state. To prevent the glitch, a strobe 426 may be used to clear and sample the decoded output of the decoder 406 during an inverted pulse of the loopback input 402. In this way, the circuitry 420 substantially guarantees selection of a single signal 412 per pulse of the loopback input 402. Thus, the circuitry 420 may reduce an occurrence of contention between the signals 412 in the multiplexer 408.

As shown, the Asynch fuse input 422 may correspond to an enable signal (e.g., from a master fuse) for the asynchronous test mode. The select signal 424 may correspond to the output of the decoder 406. The output 428 of the circuitry 420 is provided to the multiplexer 408 and used to drive the corresponding signal 412 to the output 410.

Figure 11:
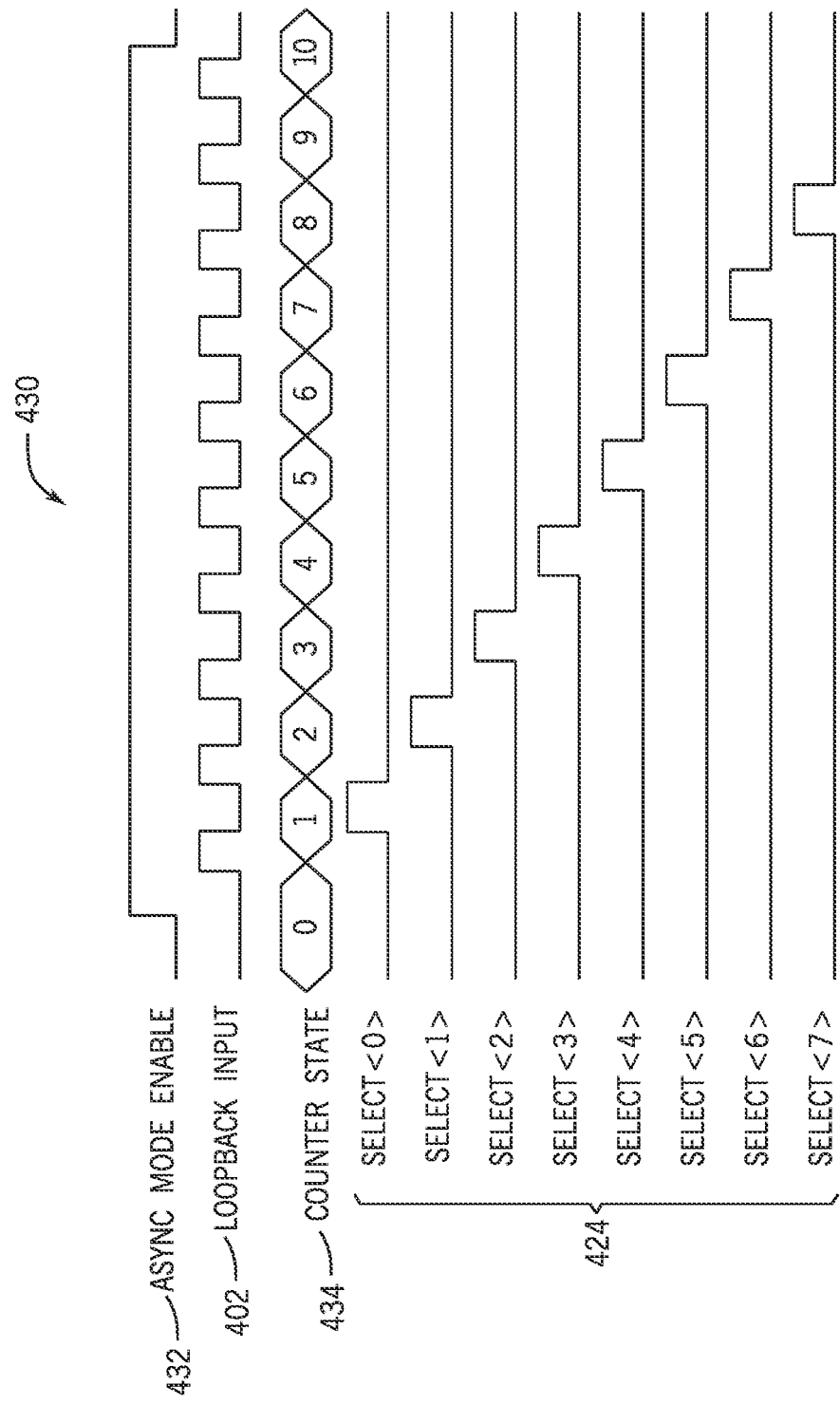
FIG. 11 illustrates a timing diagram of the asynchronous testing mode of FIGS. 9 and 10, according to embodiments of the present disclosure.

FIG. 11 illustrates a timing diagram 430 of the asynchronous testing mode of FIGS. 9 and 10, according to embodiments of the present disclosure. As shown, the timing diagram 430 depicts the asynchronous enable signal 432, the counter signal 434 and the pulsing loopback input 402. Various select signals 424 are shown and are representative of the potential signals 412 of FIG. 9. For each pulse of the loopback input 402, the value of the counter signal 434 is incremented. The value of the counter signal 434 enables a corresponding select signal 424 to be enabled (e.g., transition to a logic high). That is, each select signal 424 may correspond to a particular value of the counter signal 434. A particular select signal 424 may transition to a logic high (1) when the value of the counter corresponds to that select signal 424. Data corresponding to the particular select signal 424 may then be output by the multiplexer 408 of FIG. 9 to the LBDQS data line/output based at least in part on the enabled select signal 424 (and corresponding counter 434 value).

Figure 12:
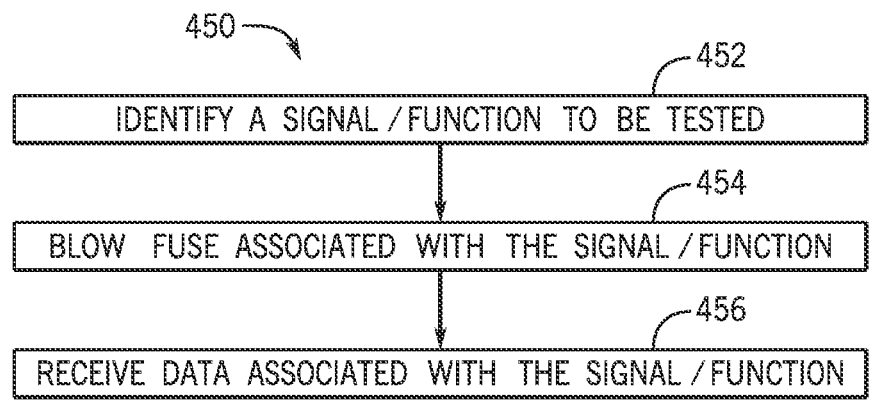
FIG. 12 is a flowchart illustrating operations of the asynchronous test mode using fuses, according to embodiments of the present disclosure.

FIG. 12 is a flowchart illustrating operations 450 of the asynchronous test mode using fuses, according to embodiments of the present disclosure. The operations 450 may be executed by a processor of a computing device in which a corresponding memory die is disposed. For example, the operations 450 may be performed by a host device external to the DIMM 150, such as the controller 128 of FIG. 1. It should be understood that, while the operations 450 are shown in a specific sequence, the operations 450 may be implemented in any suitable order, and at least some of the operations 450 may be skipped altogether. It should be understood that the operations 450 may be executed after the asynchronous test mode is initiated. That is, the operations 450 may be executed after a master fuse for the asynchronous test mode is blown, as discussed with respect to FIG. 3. In some cases, the operations 450 may include the operations 200 of FIG. 3.

At operation 452, a signal for the function to be tested is identified. As discussed above, the signal may be identified based on a failure message. In some cases, the signals/functions to be tested may be identified based on a location of the failure, such as a memory bank or memory cell (e.g., a DRAM device 152 of FIG. 2) or based on other logic in the control area. At operation 454, a fuse associated with the signal/function may be blown. In some cases, the blown fuse may be associated with the location of the failure such as register (e.g., a data register) corresponding to the identified signals/functions. At operation 456, data related to the signal/function may be received. That is, the fuse blown in operation 454 may enable access to the data associated with the identified signal/function.

Once the data related to the signal/function is received, an additional fuse associated with the signal/function may be blown to disable access to the data. The operations 450 may be repeated to obtain data associated with additional signal/functions to be tested and/or debugged.

Figure 13:
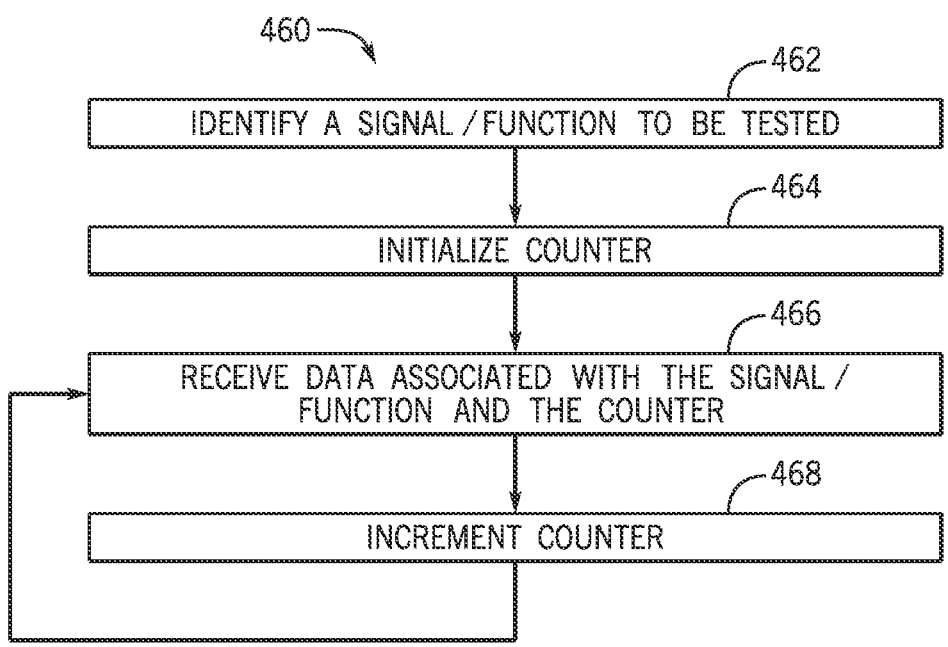
FIG. 13 is a flowchart illustrating operations of the asynchronous test mode using the counter of FIG. 9, according to embodiments of the present disclosure.

FIG. 13 is a flowchart illustrating operations 460 of the asynchronous test mode using the counter 404 of FIG. 9, according to embodiments of the present disclosure. The operations 460 may be executed by a processor of a computing device in which a corresponding memory die (e.g., the DRAM device 152 of FIG. 2) is operating. For example, the operations 460 may be performed by a host device external to the DIMM 150, such as the controller 128 of FIG. 1. It should be understood that, while the operations 460 are shown in a specific sequence, the operations 460 may be implemented in any suitable order, and at least some of the operations 460 may be skipped altogether. It should be understood that the operations 460 may be executed after the asynchronous test mode is initialized. That is, the operations 460 may be executed after a master fuse for the asynchronous test mode is blown, as discussed with respect to FIG. 3. In some cases, the operations 460 may include the operations 200 of FIG. 3.

At operation 462, one or more signals/functions to be tested are identified. In some cases, the signals/functions may be identified based on a failure message. At operation 464, a counter, such as the counter 404 of FIG. 9, is initialized at zero. As discussed with respect to FIGS. 9-11, the counter may be incremented for each pulse of a loopback input signal. At operation 466, data associated with the one or more signals/functions being tested may be received based at least in part on the value of the counter. At operation 468, the value of the counter is incremented based at least in part on a pulse of the loopback input signal.

Once the value of the counter is incremented, data associated with the next signal/function associated with the incremented value of the counter is received at operation 466. The operations 466 and 468 are repeated until all data associated with the one or more identified signals/functions is received. In that case, the value of the counter may be reset to zero and the operations 466 and 468 may be repeated until the asynchronous test mode is terminated by, for example, blowing a second master fuse associated with the asynchronous test mode. As discussed with respect to FIG. 3, the second master fuse may disable or terminate the asynchronous test mode.

Figure 14:
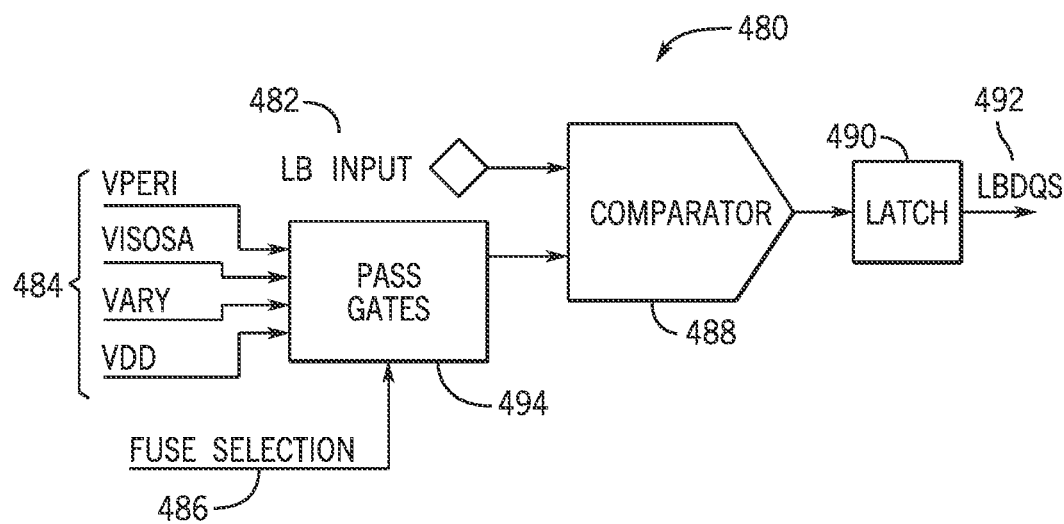
FIG. 14 illustrates a block diagram of circuitry for an analog compare mode for testing and/or debugging a memory die or an associated memory module, according to embodiments of the present disclosure.

FIG. 14 illustrates a block diagram of circuitry 480 for an analog compare mode for testing and/or debugging a memory die or an associated memory module, according to embodiments of the present disclosure. In some embodiments, the circuitry 480 may be external to the DRAM devices 152 and/or the DIMM 150 of FIG. 2. For example, the circuitry 480 may be disposed in the controller 128 of FIG. 1.

The analog compare mode may be used to determine a voltage level of one or more voltages 484 internal to a memory module, such as the DIMM 150 of FIG. 2, without exposing the voltages 484 external to the memory module. In this way, the voltage levels of the internal voltages 484 may be measured/tested without being exposed to external influences or interference.

As shown, the circuitry receives a loopback input 482. In this case, the loopback input 482 may be a reference voltage. When the analog compare mode is initialized, the loopback input 482 may be a low voltage (e.g., 0.2 volts, 0.5 volts, etc.) relative to the voltages 484 to be tested.

A number of pass gates 494 may receive one or more voltages 484 to be tested and a fuse selection 486. The fuse selection 486 may enable a particular pass gate 494 to pass-through a corresponding voltage 484 to be sampled. A comparator 488 receives the reference voltage (e.g., loopback input voltage) 482 and a selected voltage from the voltages 484. If the reference voltage 482 is equal to or greater than the selected voltage 484 from the pass gates 494, the comparator 488 may output a logic high (1). If the reference voltage 482 is less than the selected voltage 484, the comparator 488 may output a logic low (0). In that case, the reference voltage 482 may be increased and compared to the selected voltage again. For example, the reference voltage 482 may be increased by a relatively small amount, such as 0.1 volt.

For each comparison (e.g., sample), a latch 490 may temporarily latch the output of the comparator 488 and drive the output to the LBDQS pin 492. Advantageously, the analog test mode may be used to validate the internal voltages 484 while the memory module is in situ (e.g., not removed from the computing device). Further, the analog test mode may enable testing of the internal voltages 484 while the memory module is in operation. This may provide a more accurate analysis of how the internal voltages 484 are interacting while the memory module is in use.

Figure 15:
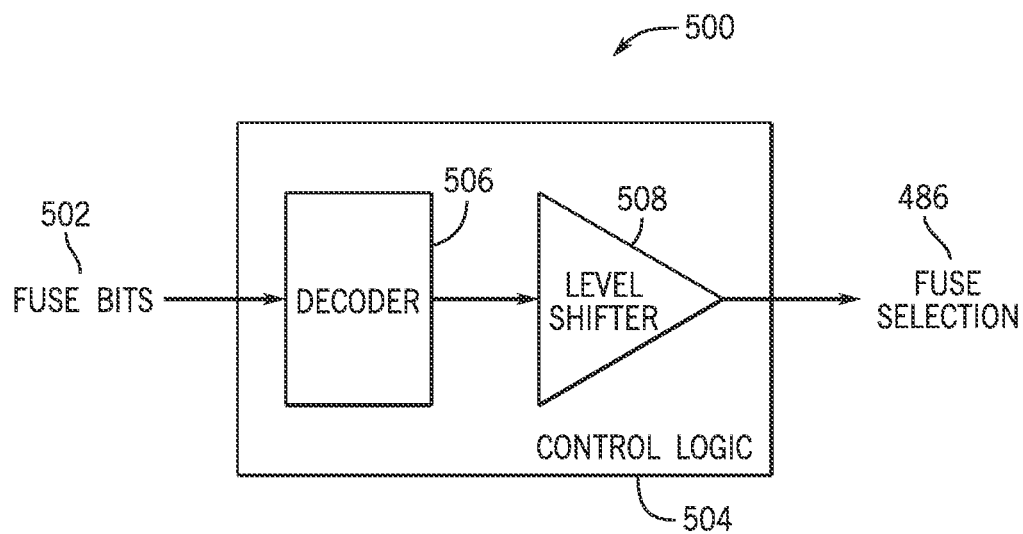
FIG. 15 illustrates a block diagram of circuitry for decoding and level shifting a fuse selection signal for the analog compare mode, according to embodiments of the present disclosure.

FIG. 15 illustrates a block diagram of circuitry 500 for decoding and level shifting a fuse selection signal for the analog compare mode, according to embodiments of the present disclosure. In some embodiments, the circuitry 500 may be external to the DRAM devices 152 and/or the DIMM 150 of FIG. 2. For example, the circuitry 500 may be disposed in the controller 128 of FIG. 1.

As shown, fuse bits 502 may be provided to control logic 504. The control logic 504 may include a decoder 506 and a level shifter 508. The level shifter 508 may level shift (e.g., increase) a voltage level of the decoded fuse bit from the decoder 506 and output the higher voltage level signals as the fuse selection signal 486. The higher voltage level may be used to enable the fuse selection signal to activate the pass gates 494 and enable the internal voltages 484 to pass to the comparator 488. The level shifted fuse selection signal may be needed due to a thick oxide of the pass gates 494.

Figure 16:
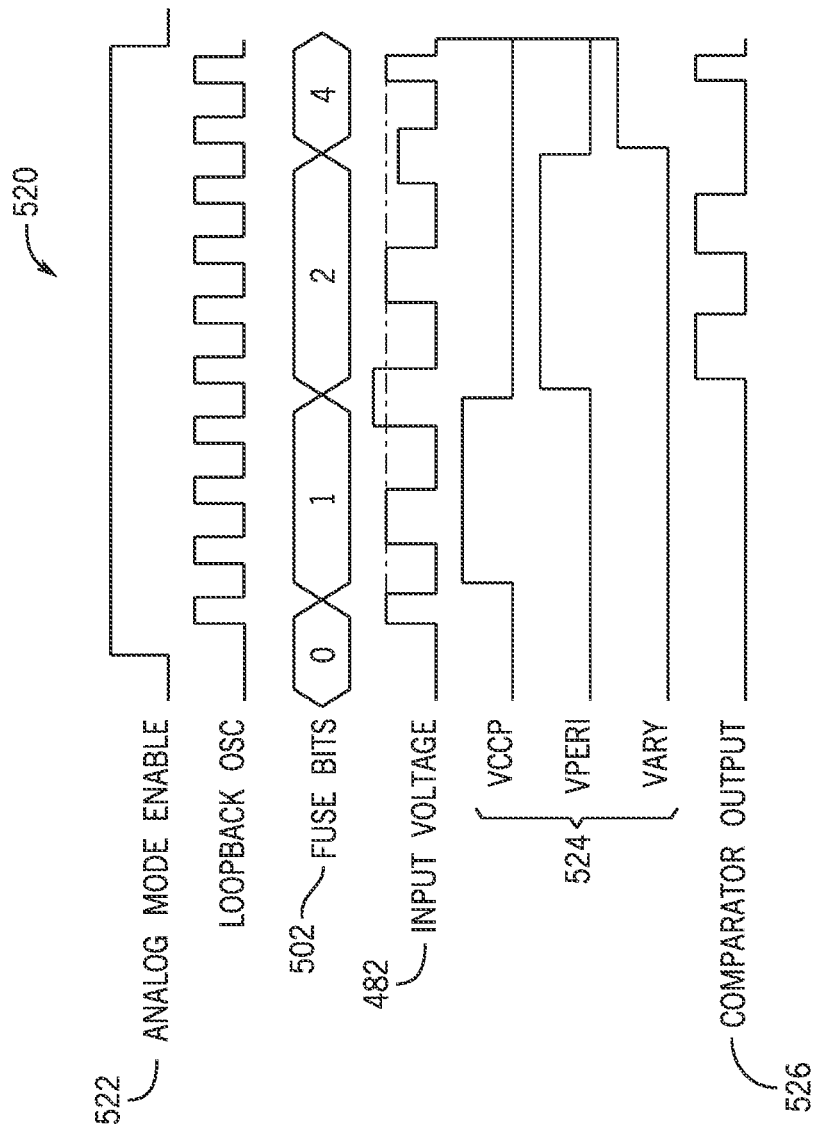
FIG. 16 illustrates a timing diagram of the analog compare mode for testing and/or debugging a voltage of a memory die, according to embodiments of the present disclosure.

FIG. 16 illustrates a timing diagram 520 of the analog compare mode for testing and/or debugging a voltage of a memory die, such as the DRAM device 152 of the DIMM 150 of FIG. 2, according to embodiments of the present disclosure. As shown, the timing diagram 520 depicts an analog mode enable signal 522, the fuse bits 502, the reference voltage 482, a number of internal voltages 524 which may correspond to the internal voltages 484 of FIG. 14, and an output 526 of the comparator 488.

As shown, each internal voltage 524 may correspond to a particular fuse bit 502. That is, when a fuse bit 502 for a first voltage 524 is enabled, the first voltage 524 may be passed through the pass gates 494 to the comparator 488 of FIG. 14. A voltage level of the reference voltage 482 may be increased until the reference voltage 482 level is equal to or greater than the first voltage level 524. In that case, the comparator output 526 may transition to the logic high (1) and be output via the LBDQS pin 492. That is, the output 526 of the comparator 488 may be used to indicate a voltage level of the first voltage 524 relative to the reference voltage 482. The output 526 of the comparator 488 may be accessed externally to the memory module (e.g., the DIMM 150) via the LBDQS pin. In some cases, the voltage level of the reference voltage 482 may be reset to the initial voltage level.

Once the output 526 of the comparator 488 transitions to the logic high, the fuse bit may change, indicating a next fuse being selected. A second voltage 524 may be passed through the pass gates 494 to the comparator 488 of FIG. 14. The voltage level of the reference voltage 482 may be increased until the reference voltage 482 is equal to or greater than the second voltage level 524. The output 526 of the comparator 488 may again transition to the logic high (1) and be output via the LBDQS pin 492. This procedure may repeat until a voltage level of each internal voltage 524 is determined based on the reference voltage 482.

Figure 17:
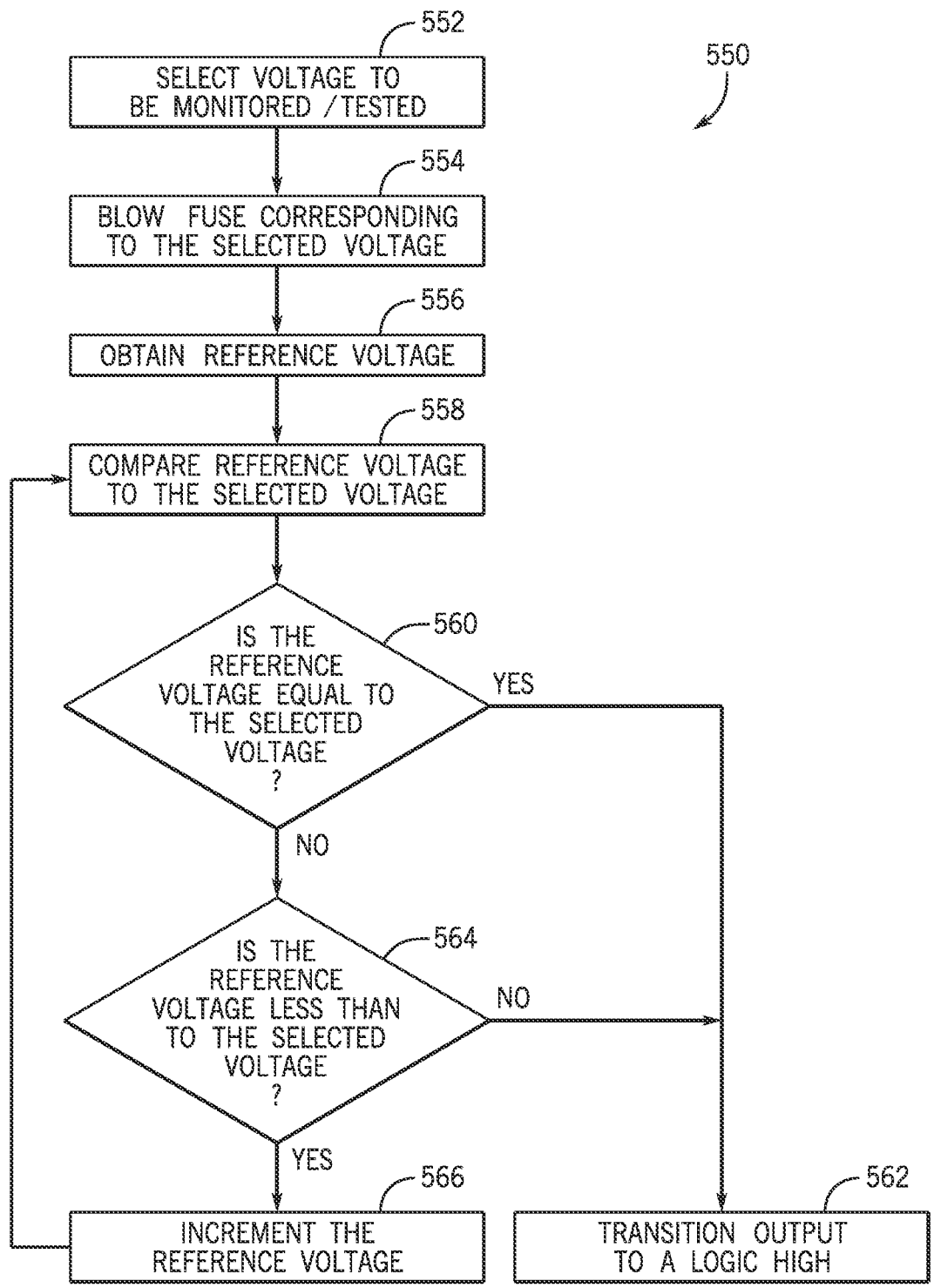
FIG. 17 is a flowchart illustrating operations for the analog compare mode, according to embodiments of the present disclosure.

FIG. 17 is a flowchart illustrating operations 550 for the analog compare mode, according to embodiments of the present disclosure. The operations 550 may be executed by a processor or controller of a computing device in which a corresponding memory module, such as the DIMM 150 of FIG. 2, is operating. For example, the operations 550 may be performed by a host device external to the DIMM 150, such as the controller 128 of FIG. 1. It should be understood that, while the operations 550 are shown in a specific sequence, the operations 550 may be implemented in any suitable order, and at least some of the operations 550 may be skipped altogether. It should be understood that the operations 550 may be performed after the analog compare mode is initialized. That is the operations 550 may be executed after a master fuse for the analog compare mode is blown, as discussed with respect to FIG. 3. In some cases, the operations 550 may include the operations 200 of FIG. 3.

At operation 552, one or more voltages are selected to be tested or monitored using the analog compare mode. The selected voltages may be internal to a memory die (e.g., a DRAM device 152 of FIG. 2) and may be selected based on a failure message or a location of a failure within a corresponding memory module (e.g., the DIMM 150 of FIG. 2). At operation 554, a fuse corresponding to a first selected voltage may be blown. The blown fuse may enable the first selected voltage to propagate through the pass gates 494 and to the comparator 488 of FIG. 14. At operation 556, a reference voltage may be obtained. As discussed above, the reference voltage may be received via the LBDQ pin of the memory module.

At operation 558, the reference voltage is compared to the first internal voltage. At operation 560, the comparator may determine if the reference voltage is equal to the first internal voltage. If so, the output of the comparator may transition to the logic high, at operation 562. If the reference voltage is not equal to the first internal voltage, the comparator determines if the reference voltage is less than the first internal voltage, at operation 564.

If the reference voltage is not less than the first internal voltage, then the reference voltage is greater than the first internal voltage and the output of the comparator may transition to the logic high, at operation 562. If the reference voltage is less than the first internal voltage at operation 564, the reference voltage may be incremented (e.g., increased), at operation 566. In that case, the incremented reference voltage may again be compared to the first internal voltage at operation 558.

The operations 558-566 may be repeated until the output of the comparator transitions to the logic high. In that case, a fuse for a second selected (internal) voltage level may be blown at operation 554 and the operations 556-566 may be repeated for the second internal voltage, until the output of the comparator transitions to the logic high. The operations 554-566 may be repeated for each of the selected internal voltages to be monitored and/or tested.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory module, comprising:
    a plurality of memory devices, each of the plurality of memory devices comprising a plurality of memory cells disposed in parallel arrays;
    a first set of data lines corresponding to a loopback data (LBDQ) signal and coupled to each of the plurality of memory devices and a first pin; and
    a second set of data lines corresponding to a loopback data strobe (LBDQS) signal and coupled to each of the plurality of memory devices and a second pin, wherein the first pin and the second pin are accessible external to the memory module, and wherein the first set of data lines and the second set of data lines are configured to enable access to data corresponding to each of the plurality of memory devices via the first pin and the second pin for a debugging operation while the memory module is in operation, and
    wherein the memory module comprises a dual in-line memory module (DIMM), and
    wherein each of the plurality of memory devices comprises a volatile memory device.

2. The memory module of claim 1, comprising at least two fuses associated with the plurality of memory devices.

3. The memory module of claim 2, wherein the at least two fuses are configured to provide the data associated with the plurality of memory devices.

4. The memory module of claim 3, wherein the at least two fuses comprise a first fuse configured to provide access to the data associated with the plurality of memory devices and a second fuse configured to terminate access to the data associated with the plurality of memory devices.

5. The memory module of claim 1, comprising a plurality of master fuses associated with a synchronous test mode, an asynchronous test mode, and an analog compare mode.

6. The memory module of claim 5, wherein the data corresponding to the plurality of memory devices for the synchronous test mode provides an indication of logic states of signals associated with the plurality of memory devices, wherein the signals correspond to an impedance (ZQ) calibration signal, a CBR counter, a state of the delayed lock loop (DLL) lock point, an ECS error count, a temperature sensor, or a DQS oscillator.

7. The memory module of claim 5, wherein the data corresponding to the plurality of memory devices for the asynchronous test mode provides an indication of a signal transition in the plurality of memory devices, wherein the indication corresponds to an LBQ oscillator, a DLL shift output, a DLL lock, an array voltage level (e.g., VARY), a read event, or a write event.

8. The memory module of claim 5, wherein the data corresponding to the plurality of memory devices for the analog compare mode provides an indication of a voltage level internal to the plurality of memory devices.

9. The memory module of claim 5, wherein each respective one of the plurality of master fuses is only associated with one of the synchronous test mode, the asynchronous test mode, or the analog compare mode.

10. The memory module of claim 5, wherein each respective one of the plurality of master fuses is only associated with one of the plurality of memory devices.

11. The memory module of claim 1, wherein the memory module comprises a double data rate type five synchronous dynamic random access memory (DDR5 SDRAM) device.

12. The memory module of claim 1, wherein the debugging operation corresponds to a synchronous test mode, and wherein the memory module comprises a plurality of registers each configured to receive a respective signal from the plurality of memory devices, wherein each respective signal is associated with a signal to be monitored from at least one of the memory devices, during the synchronous test mode.

13. The memory module of claim 12, wherein the memory module comprises a serializer configured to receive the data from each of the plurality of registers and configured to output a serialized loopback data signal.

14. The memory module of claim 1, wherein the debugging operation corresponds to an asynchronous test mode, and wherein the memory module comprises circuitry comprising a counter configured to increment based at least in part on an oscillating input signal, wherein the data is based at least in part on a value of the counter.

15. The memory module of claim 14, wherein the circuitry comprises a decoder configured to receive and a counter value from the counter, and a multiplexer configured to receive a decoded counter value from the decoder and to output the loopback data signal.

16. The memory module of claim 15, wherein the circuitry comprises glitch prevention circuitry coupled between the decoder and the multiplexer and configured to prevent glitch propagation through the decoder.

17. The memory module of claim 1, wherein the debugging operation corresponds to an analog compare mode, and wherein the memory module comprises circuitry to determine a voltage level of one or more analog voltage signals internal to the memory module.

18. The memory module of claim 17, wherein the circuitry comprises a comparator configured to:
    compare a voltage level of the one or more analog voltage signals to a voltage level of a reference voltage;
    upon determining that the voltage level of the reference voltage is less than the voltage level of the one or more analog voltage signals, increase the voltage level of the reference voltage and output a logic low signal; and
    upon determining the voltage level of the reference voltage is greater than or equal to the voltage level of the one or more analog voltage signals, output a logic high signal.

19. The memory module of claim 18, wherein the circuitry comprises a plurality of pass gates configured to receive the one or more analog voltage signals and select one of the one or more voltage signals based on a selection signal, and to output the one of the one or more voltage signals to the comparator to compare the voltage level of the one of the one or more voltage signals to the voltage level of the reference voltage.

20. The memory module of claim 18, wherein the memory module comprises control logic for decoding and shifting an input signal, and wherein the control logic comprises a level shifter configured to provide the selection signal to the plurality of pass gates.

* * * * *